United States Patent [19]

Sato et al.

[11] Patent Number: 4,628,347
[45] Date of Patent: Dec. 9, 1986

[54] CHARGE TRANSFER DEVICE FOR MULTIPLEXING SIGNALS

[75] Inventors: Maki Sato, Sagamihara; Takeo Hashimoto, Machida, both of Japan

[73] Assignee: Sony Corporation, Tokyo, Japan

[21] Appl. No.: 576,372

[22] PCT Filed: May 19, 1983

[86] PCT No.: PCT/JP83/00150

§ 371 Date: Jan. 19, 1984

§ 102(e) Date: Jan. 19, 1984

[87] PCT Pub. No.: WO83/04344

PCT Pub. Date: Dec. 8, 1983

[30] Foreign Application Priority Data

May 21, 1982 [JP] Japan ................... 57-86258

[51] Int. Cl.$^4$ ............ H04N 9/64; H04N 9/077; H01L 29/78; G11C 19/28

[52] U.S. Cl. .................. 358/39; 358/21 R; 358/30; 358/37; 358/44; 357/24; 377/62; 377/63

[58] Field of Search ............... 357/24, 24 LR; 358/41, 358/43, 44, 21 R, 30, 31, 37, 39, 40, 213, 293, 294; 377/57, 61, 62, 63

[56] References Cited

U.S. PATENT DOCUMENTS

| | | | |
|---|---|---|---|
| 4,131,913 | 12/1978 | Yamanaka et al. | 358/44 |
| 4,242,700 | 12/1980 | Weimer | 358/213 |
| 4,287,536 | 9/1981 | Wiggins | 358/293 |
| 4,454,534 | 6/1984 | Lüder et al. | 358/31 |
| 4,513,313 | 4/1985 | Kinoshita et al. | 358/44 |
| 4,540,901 | 9/1985 | Suzuki | 377/61 |
| 4,551,758 | 11/1985 | Masunaga et al. | 357/24 LR |
| 4,559,550 | 12/1985 | Koike et al. | 377/62 |
| 4,575,763 | 3/1986 | Elabd | 358/213 |

FOREIGN PATENT DOCUMENTS

| | | | |
|---|---|---|---|
| 105284 | 9/1976 | Japan . | |
| 21519 | 2/1978 | Japan | 358/213 |
| 4545 | 1/1979 | Japan | 377/57 |
| 163973 | 12/1980 | Japan . | |
| 10591 | 1/1982 | Japan . | |

OTHER PUBLICATIONS

Séquin, Carlo H., et al., *Charge Transfer Device: The Foundation and Application of CCD and BBD*, Japanese Translation of English Original by Takeishi Yoshiyuki et al., Kindai Kagakusha, pp. 54–55, 02/20/78.

*Primary Examiner*—John W. Shepperd
*Assistant Examiner*—Randall S. Svihla
*Attorney, Agent, or Firm*—Hill, Van Santen, Steadman & Simpson

[57] ABSTRACT

The present invention relates to a charge transfer device for multiplexing signals and eliminates an output circuit and level adjusting circuit necessary for multiplexing signals in the prior art. There are provided at least two first and second transfer channels (34) and (35) for transferring signal charges and a third transfer channel (36) for alternately multiplexing the signal charges which are transferred within the transfer channels (34) and (35). To the first and second transfer channels (34) and (35) is supplied the same transfer clock signal and to the third transfer channel is supplied a second transfer clock signal with a frequency of which is n times the transfer channels before the signals are multiplexed. a multiphase clock with different phases of the clock being applied to spatially corresponding electrodes is used in the invention. The present invention can be used as a signal multiplexing charge transfer device for a color solid state image sensor which uses an image sensing element such as CCD.

2 Claims, 38 Drawing Figures

FIG. 4
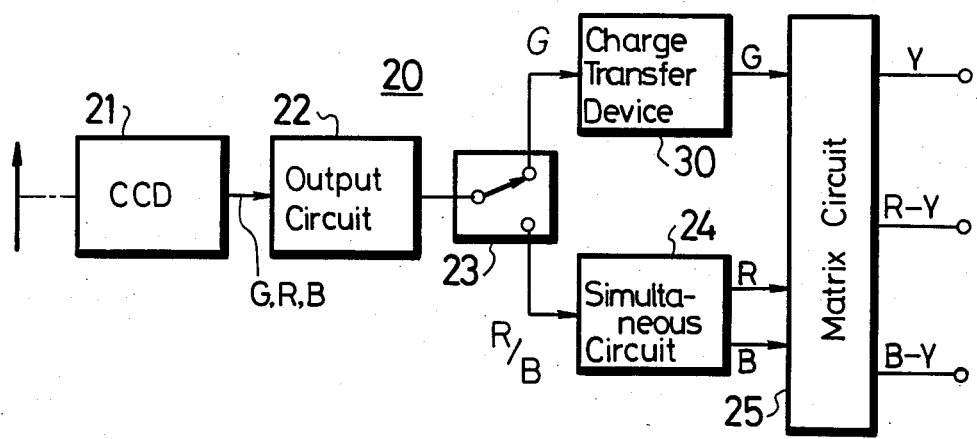
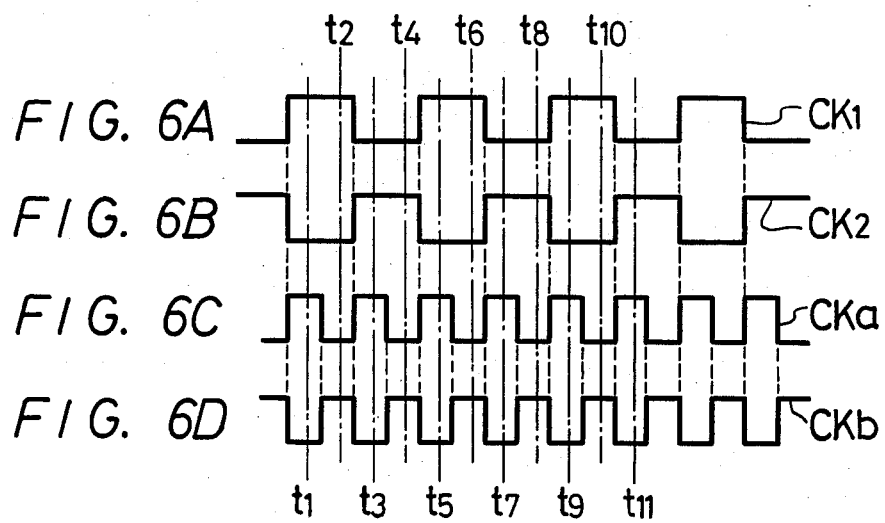

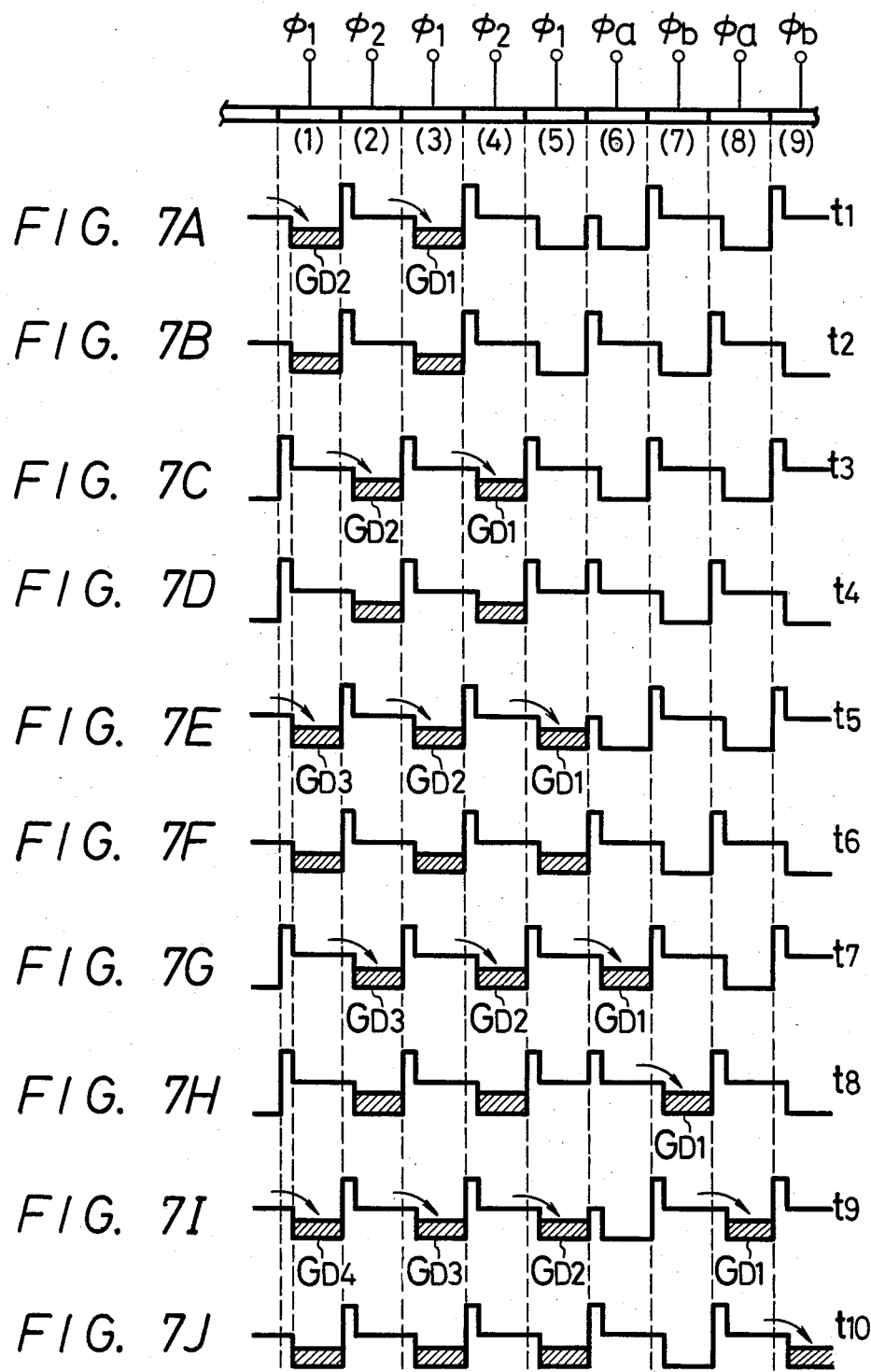

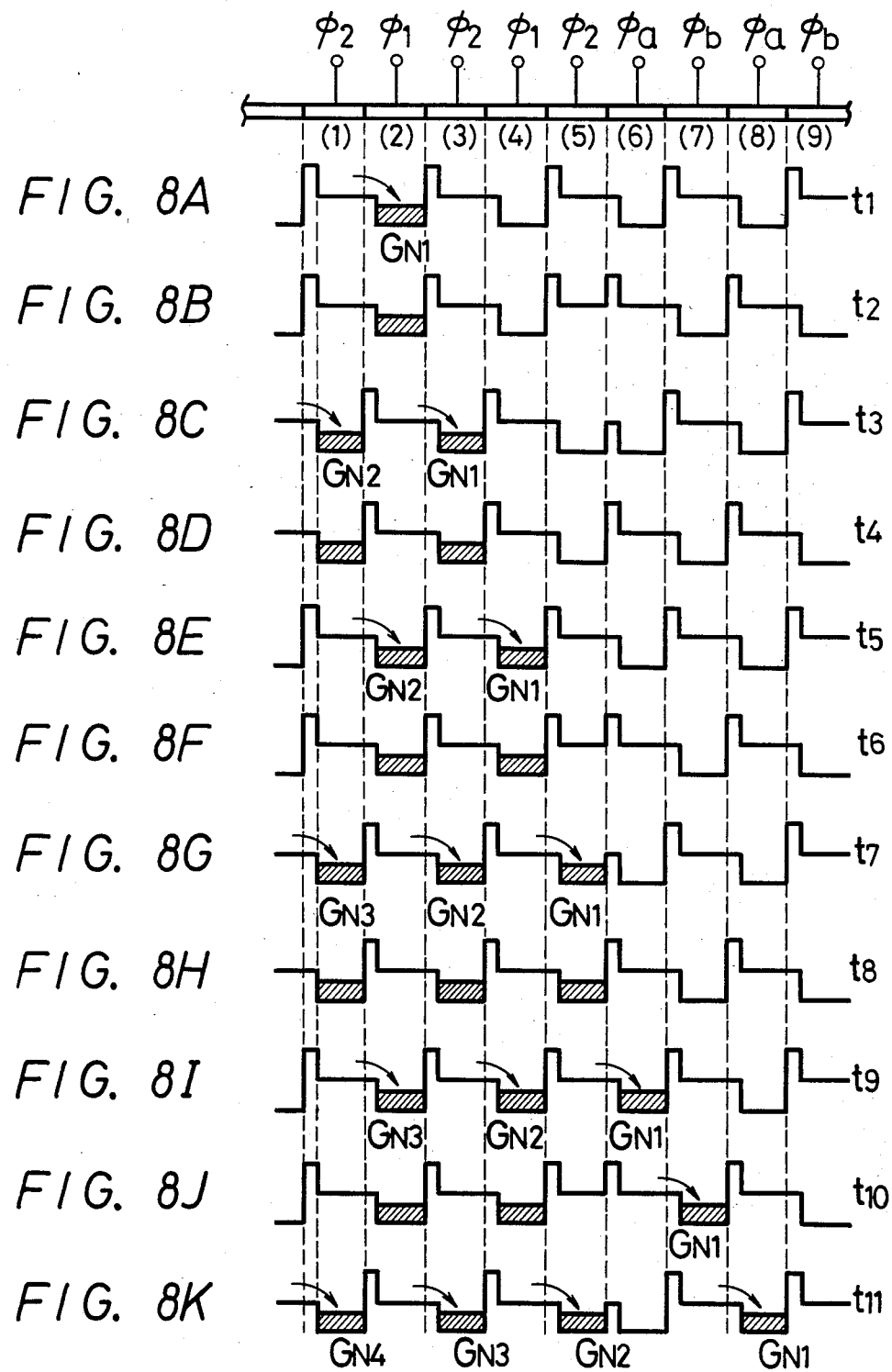

FIG. 9
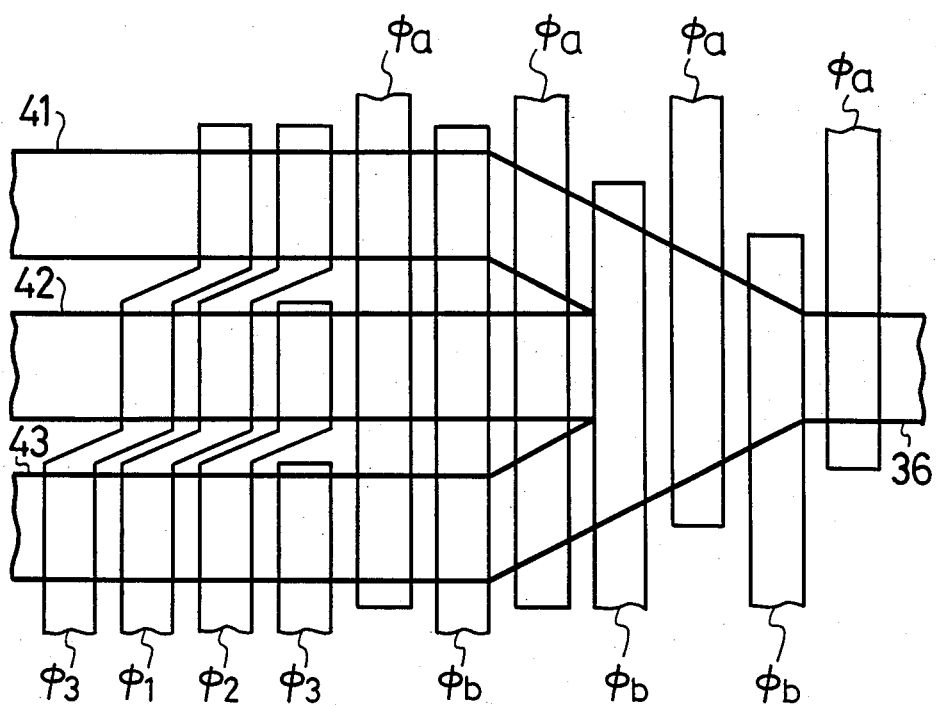

CHARGE TRANSFER DEVICE FOR MULTIPLEXING SIGNALS

DESCRIPTION

1. Technical Field

The present invention relates to a charge transfer device for multiplexing signals suitable for use as a color solid state image pick-up device or sensor which uses a charge transfer element such as a CCD or the like as its image sensing element.

2. Background Art

When, for example, there are a first signal (sampling output or the like) $S_A$ of a time series as shown in FIG. 1A and a second signal $S_B$ (FIG. 1B) of a time series the phase of which is different from that of the first signal by 180°, it is desired that the signals $S_A$ and $S_B$ be multiplexed to form a third signal $S_C$ of a time series as shown in FIG. 1C, the frequency of which is raised to twice as high as the signals $S_A$ or $S_B$.

Such signal processing is required in a case where the number of picture elements of the CCD used as, for example, the image sensing elements is reduced but the resolution in the horizontal or vertical direction is increased.

When a color filter 1 having a checkered color alignment as shown in FIG. 2 is utilized to generate from the CCD an image signal, particularly a green primary color signal G, the color alignment is different by $\tau_H$ ($\tau_H$ represents the alignment pitch of the picture elements in the horizontal direction) between the odd and the even lines. Accordingly, with respect to the green signal G, on the odd line appears the signal $S_A$ of the time series shown in FIG. 1A, while on the even line appears the signal $S_B$ of the time series shown in FIG. 1B.

Therefore, if the green signals G having such time series are made simultaneous and then multiplexed with each other, the amount of information of the green signal derived from each horizontal line becomes twice as great and the horizontal resolution can be greatly improved as compared with the case in which the green signals are not multiplexed.

FIG. 3 shows an example of a signal processing circuit 10 used in this case which is formed of a delay element 11 of one horizontal period (1H) and a switching circuit 12 for multiplexing. To an input terminal 13 is supplied a green signal (voltage) $G_N$ which is derived from the CCD so that when the green signal (delayed output) $G_D$ delayed by 1H and the current green signal (non-delayed output $G_N$) are multiplexed with each other in the switching circuit 12, the delayed output $G_D$ will be multiplexed such that the delayed output is also converted to the proper voltage level.

Accordingly, when the delay element 11 is formed of a CCD, at the output stage of the delay element 11 there must be provided an output circuit 14 which converts a signal charge to a voltage. Since, of course, the output circuit 14 has a temperature characteristic, a difference in signal level occurs between the delayed output $G_D$ and the non-delayed output $G_N$. As a result, it is usual that in addition to the output circuit 14, there is provided a level adjusting circuit 15.

As described above, the conventional signal processing circuit (multiplexer) must include the output circuit 14 which converts the signal charge to a voltage and also the level adjusting circuit 15.

DISCLOSURE OF INVENTION

In view of the above aspects, an object of the present invention is to provide a charge transfer device for multiplexing signals which can multiplex signals particularly such that the signals remain in charge form. According to the charge transfer device for multiplexing signals of the present invention, a circuit which operates without an output circuit used to convert the signal charges to a voltage and without a level adjusting circuit can be used to multiplex two or more signals with each other.

Another object of the present invention is to provide a charge transfer device for multiplexing signals which can be formed on one chip.

BRIEF DESCRIPTION OF DRAWINGS

FIG. 4 is a systematic block diagram showing an example of a video signal generating circuit useful for explaining the present invention;

FIGS. 6A-6D are waveform diagrams of transfer clock pulses used therefor,

FIGS. 7A-7J and 8A-8K respectively charge transfer diagrams useful for explaining the operation thereof;

FIG. 9 is an explanatory diagram similar to FIG. 5 showing another embodiment of the present invention, and FIGS. 10A-10E are waveform diagrams of a transfer clock pulse used therefor.

BEST MODE FOR CARRYING OUT THE INVENTION

An embodiment of the present invention which is applied to the above signal processing circuit will be described with reference to FIG. 4 and the following description.

Figure 2:
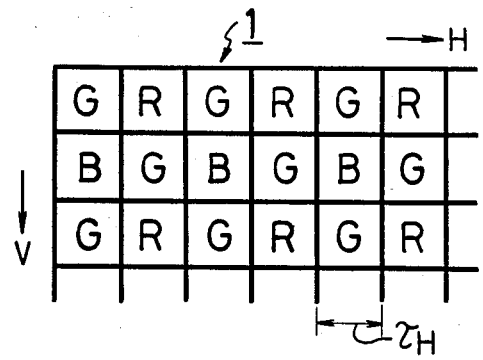
FIG. 2 is an arrangement diagram showing an example of a color filter.

FIG. 4 shows a video signal generating circuit which employs as its color filter the color filter 1 having the construction shown in FIG. 2. Thus, from a CCD 21 are derived dot sequential signals of G, R and B which then are at once converted to a voltage by an output circuit 22. The dot sequential signals converted to the voltage level are separated into a green signal G and into a red and blue line sequential signal R/B by a signal separating circuit 23. The line sequential signal R/B is further supplied to a simultaneous circuit 24 which separates the signals and converts them to signals R and B.

On the other hand, the green signal G is supplied to a charge transfer device 30 according to the present invention in which it is multiplexed and then supplied to a matrix circuit 25 together with the simultaneous signals R and B from which a desired video signal is produced. In this embodiment, there are formed a luminance signal Y and a pair of color difference signals $R-Y$ and $B-Y$.

Figure 3:
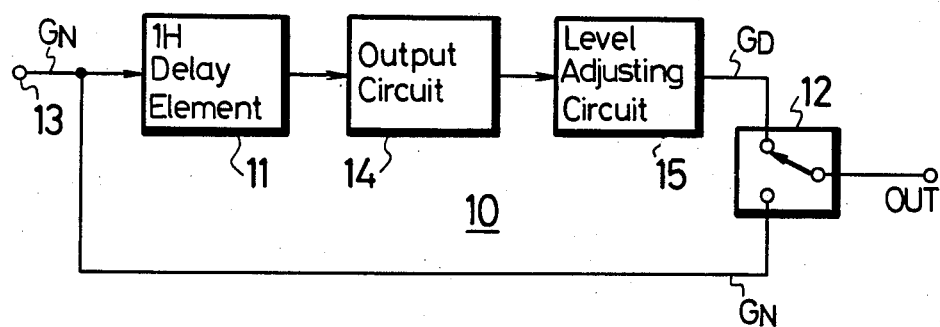
FIG. 3 is a systematic block diagram of a color signal processing circuit.

The charge transfer device 30 corresponds to the signal processing circuit (multiplexer) shown in FIG. 3 and has a function such that as mentioned before, after the green signal G is delayed by 1H, the delayed output $G_D$ and the non-delayed output $G_N$ are multiplexed with each other.

Figure 5:
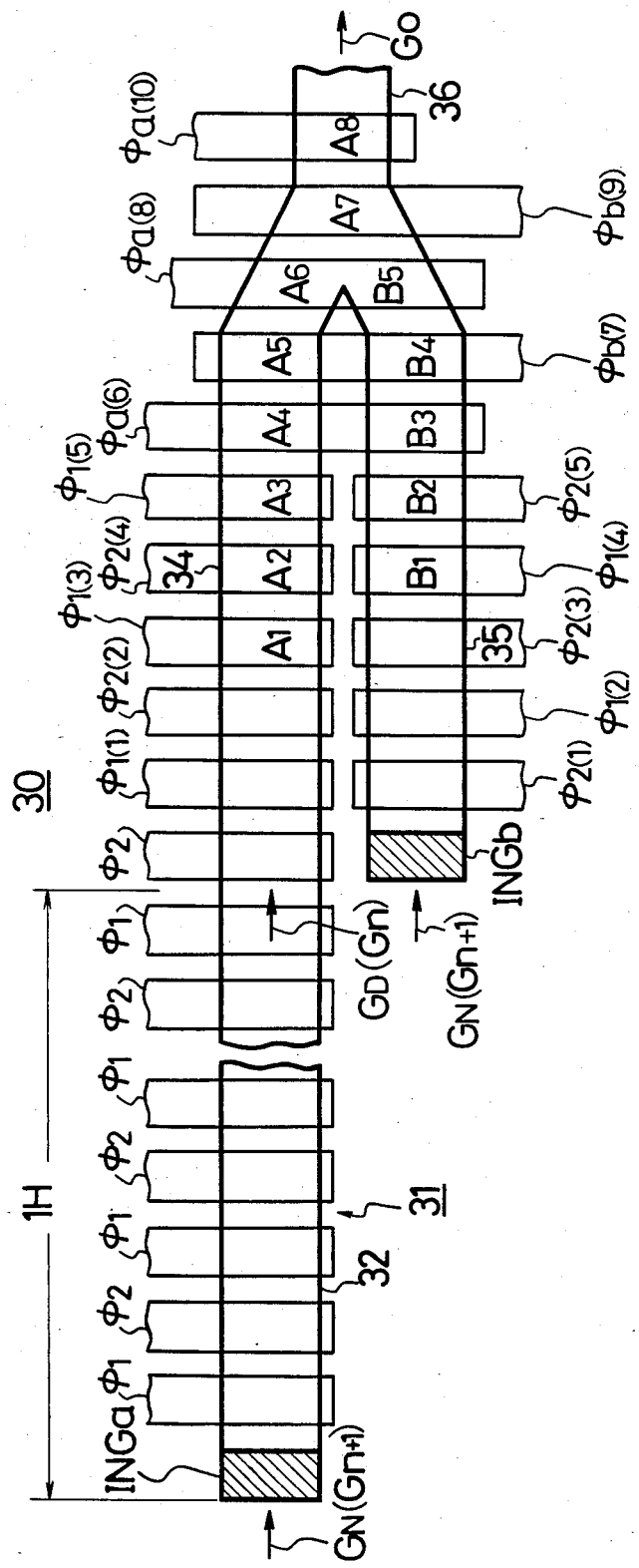
FIG. 5 is an explanatory diagram showing an example of a case in which a charge transfer device according to the present invention is applied to a video signal generating circuit.

FIG. 5 shows an embodiment of the charge transfer device 30 according to the present invention. For convenience sake of explanation, this drawing is a conceptual construction diagram in which transfer channels formed in the element are shown as flat.

In FIG. 5, reference numeral 31 designates a delay element of 1H which is constructed by a charge transfer element (CCD) formed of with a surface channel or a buried channel. Reference numeral 32 designates a transfer channel and a green signal $G_N$ is supplied to an input gate INGa. In this embodiment, the transfer of signal charges is carried out by a 2-phase clock system so that there are provided 2-phase transfer electrodes $\phi_1$ and $\phi_2$. Since the construction and the method of forming of the transfer electrodes $\phi_1$ and $\phi_2$ can utilize the well-known techniques of the prior art, their construction will not be described.

The green signal delayed by 1H, namely, the delayed output $G_D$ is supplied to a first transfer channel 34 as signal charges. The first transfer channel 34 is also constructed the same as the transfer channel 32 for the delay element. Similarly, the non-delayed output $G_N$ is applied to an input gate INGb of a second transfer channel 35. The first and second transfer channels 34 and 35 are coupled as shown in the figure to form a third transfer channel 36.

The first and second transfer channels 34 and 35 are selected so as to be equal in channel length.

When the transfer of the signal charge is carried out by 2-phase transfer clocks, there are applied to the transfer electrodes $\phi_1$ and $\phi_2$, which are formed on the delay element transfer channel 32 and the first transfer channel 34, transfer clocks $CK_1$ and $CK_2$ (FIGS. 6A and 6B) which have opposite phases. The frequencies of the transfer clocks $CK_1$ and $CK_2$ are the same as the frequency of the clock (sampling clock) supplied to the CCD 21 which is used as the image sensing element.

The transfer electrodes $\phi_1$ and $\phi_2$ formed on the second transfer channel 35 are positioned relative to the transfer electrodes $\phi_1$ and $\phi_2$ formed on the first transfer channel 34 such that the alignment pitch thereof is displaced from that of the latter by one element. Accordingly, when the transfer electrodes formed on the first transfer channel 34 ends with $\phi_1$ as shown in the figure, the transfer electrodes formed on the second transfer channel 35 will end with $\phi_2$.

Figure 1A:
FIGS. 1A to 1C are explanatory diagrams of a multiplex scheme.
Figure 1B:
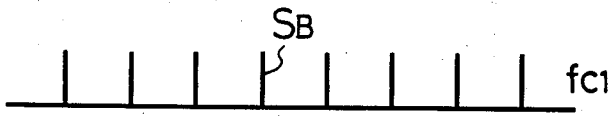
Figure 1C:

The transfer electrodes $\phi_1$ and $\phi_2$ are formed before the transfer channels are coupled. Then the, transfer electrodes $\phi_a$ and $\phi_b$ for the third transfer channel 36 are provided. In this case, the transfer electrodes $\phi_a$ and $\phi_b$ are positioned on the first and second transfer channels 34 and 35 are provided common. To these transfer electrodes $\phi_a$ and $\phi_b$ are supplied 2-phase transfer clocks CKa and CKb (FIGS. 6C and 6D), each having a clock frequency of $2f_{c1}=f_{c2}$ which are illustrated in FIGS. 1A and 1C.

The charge transfer state of the charge transfer device 30 thus constructed will be described with reference to FIGS. 7 and 8.

FIGS. 7A-7J show the transfer state of the delayed output $G_D$ at each time shown in FIGS. 6A-6D, in which reference characters $GD_1$, $GD_2$, ... represent picture element informations regarding the green signal G, each picture element information being delayed by 1H. Similarly, FIGS. 8A-8K show the transfer state of the non-delayed output $G_N$ at each time shown in FIGS. 6A-6D, in which reference characters $GN_1$, $GN_2$, ... represent similar picture element informations for the green signal G.

As will be clear from the figures, the delayed output $G_D$ and the non-delayed output $G_N$ respectively are transferred through the independent transfer channels 34 and 35 and are alternately delivered in turn in response to the clock pulses CKa and CKb after time $t_9$ and then are alternately transferred through one transfer channel 36. Thus, the outputs $G_D$ and $G_N$ are multiplexed to produce a synthesized output $G_o$ which has an amount of information which is twice as large as that before being synthesized.

As set forth above, according to the present invention, since at least two signals of the same time series which are different only in phase are multiplexed to form a single signal having a new time series of signal charge, a significant improvement results.

Particularly when the above checkered picture element information is high in content without increasing the number of the picture elements in the CCD to thereby improve the horizontal resolution, the signal processing as shown in FIG. 3 must be carried out. The present invention is suitable for being applied to such signal processing system.

Namely, in the signal processing circuit shown in FIG. 3, the output circuit 14 and the level adjusting circuit 15 must be provided, respectively, as mentioned above, and because of these circuits, such signal processing circuit can not be formed as one chip. On the contrary, in the invention according to the embodiment, all signal processings can be carried out on the signal charges so that the above output circuit 14 and level adjusting circuit 15 can be omitted and all of the elements can be incorporated into one charge transfer element, thus enabling the signal processing circuit to be formed as one chip.

While in the above embodiment two transfer channels are provided to thereby multiplex the respective signals, a version is also possible such that as shown in FIG. 9 signal charges from three transfer channels 41 to 43 are multiplexed to produce a multiplexed output with the frequency being three times as high as the signals before being multiplexed. In this case, before the signal charges are multiplexed, the signal charges are transferred in response to 3-phase transfer clock pulses $CK_1$ to $CK_3$ shown in FIGS. 10A to 10C, and after the signal charges are multiplexed, the signal charges are transferred in response to 2-phase clock pulses CKa and CKb shown in FIGS. 10D and 10E. Then, the transfer state of the signals before being multiplexed is controlled so that the respective signals have a phase difference of 120° between them. Therefore, the alignment of the transfer electrodes $\phi_1$ to $\phi_3$ becomes as shown in FIG. 9.

While in the above, the present invention is applied to the color signal processing circuit for a color solid state image sensor, the present invention can also be applied to other video processing circuits.

We claim:

1. A charge transfer device for multiplexing signals comprising: first and second charge-coupled transfer channels for transferring signal charges arranged side-by-side, each channel having a plurality of transfer electrodes which are aligned with corresponding transfer electrodes of the other channel, a third charge-coupled transfer channel arranged to alternately receive signal charges from said first and second charge-coupled transfer channels and having a plurality of transfer electrodes, said transfer electrodes of said first and second charge-coupled channels receiving first clock signals with said corresponding aligned transfer electrodes receiving said first clock signals at different phases, said transfer electrodes of said third charge-coupled transfer channel receiving second clock signals which have a frequency of two times said first clock signals, wherein a pair of input signals is applied to said first and second charge-coupled transfer channels and an output means receives an output of said third charge-coupled transfer channel.

2. A charge transfer device for multiplexing signals comprising: first, second and third charge-coupled transfer channels for transferring signal charges arranged side-by-side, a fourth charge-coupled transfer channel arranged to alternately receive signal charges from said first, second and third charge-coupled transfer channels, a first plurality of transfer electrodes extending transversely over said first, second and third transfer channels, each of said first plurality of transfer electrodes having portions longitudinally offset from each other such that a particular transfer electrode portion over said first transfer channel is offset from a transfer electrode portion over said second transfer channel which in turn is offset from a transfer electrode portion over said third transfer channel, a second plurality of transfer electrodes extending transversely over said, first, second and third transfer channels, and a third plurality of transfer electrodes extending over said fourth transfer channel.

* * * * *